(12) United States Patent
Schlichting et al.

(10) Patent No.: US 8,323,409 B2
(45) Date of Patent: Dec. 4, 2012

(54) SYSTEMS AND METHODS FOR FORMING COMPONENTS WITH THERMAL BARRIER COATINGS

(75) Inventors: Kevin W. Schlichting, Storrs, CT (US); Donald G. Broadhurst, East Hartford, CT (US); John H. Hyde, South Meriden, CT (US); John F. Blondin, South Windsor, CT (US)

(73) Assignee: United Technologies Corporation, Hartford, CT (US)

(*) Notice: Subject to any disclaimer, the term of this patent is extended or adjusted under 35 U.S.C. 154(b) by 1170 days.

(21) Appl. No.: 12/117,019

(22) Filed: May 8, 2008

(65) Prior Publication Data

US 2009/0324852 A1 Dec. 31, 2009

(51) Int. Cl.
*B05C 13/00* (2006.01)
*B05C 13/02* (2006.01)
*B05C 21/00* (2006.01)
*B05C 11/11* (2006.01)
*C23C 16/00* (2006.01)
*B05D 1/02* (2006.01)

(52) U.S. Cl. ........ 118/720; 118/500; 118/504; 118/505; 118/721; 118/728; 118/729; 427/251; 427/255.5; 427/425

(58) Field of Classification Search .................. None
See application file for complete search history.

(56) References Cited

U.S. PATENT DOCUMENTS

| | | | |
|---|---|---|---|
| 3,749,058 A * | 7/1973 | Slabaugh | 118/500 |
| 4,108,107 A * | 8/1978 | Scheuermann | 118/730 |
| 5,087,477 A | 2/1992 | Giggins, Jr. et al. | |
| 5,216,808 A | 6/1993 | Martus et al. | |
| 5,601,652 A | 2/1997 | Mullin et al. | |
| 5,803,971 A * | 9/1998 | Menchetti et al. | 118/500 |
| 5,849,359 A * | 12/1998 | Burns et al. | 118/503 |
| 5,972,424 A | 10/1999 | Draghi et al. | |
| 5,997,947 A * | 12/1999 | Burns et al. | 427/240 |
| 6,042,898 A | 3/2000 | Burns et al. | |
| 6,258,226 B1 | 7/2001 | Conner | |
| 6,352,406 B1 | 3/2002 | Clare et al. | |
| 6,391,115 B1 * | 5/2002 | Marszal et al. | 118/500 |
| 6,479,101 B2 * | 11/2002 | Gartner | 427/255.5 |
| 6,709,514 B1 * | 3/2004 | Hossainy | 118/52 |
| 7,192,622 B2 | 3/2007 | Fernihough et al. | |
| 7,311,981 B2 | 12/2007 | Saint Ramond et al. | |
| 7,335,429 B2 | 2/2008 | Lee et al. | |

* cited by examiner

*Primary Examiner* — Laura Edwards
*Assistant Examiner* — Binu Thomas
(74) *Attorney, Agent, or Firm* — Carlson, Gaskey & Olds PC

(57) ABSTRACT

Systems and methods for forming components with thermal barrier coatings are provided. In this regard, a representative method includes: providing a component having a first side and an opposing second side; and using a preformed mask to obstruct vapors from being deposited on the second side of the component while moving the component relative to the vapors such that the vapors form a thermal barrier coating on the first side of the component.

22 Claims, 4 Drawing Sheets

SYSTEMS AND METHODS FOR FORMING COMPONENTS WITH THERMAL BARRIER COATINGS

STATEMENT REGARDING FEDERALLY SPONSORED RESEARCH AND DEVELOPMENT

The U.S. Government may have an interest in the subject matter of this disclosure as provided for by the terms of contract number F33657-98-D-0018 awarded by the United States Air Force.

BACKGROUND

1. Technical Field

The disclosure generally relates to thermal barrier coatings.

2. Description of the Related Art

Thermal barrier coatings are provided on various types of components that typically are exposed to high temperature environments. In this regard, gas turbine engine components, such as turbine blades and combustion section components (e.g., liners), are candidates for receiving such coatings.

SUMMARY

Systems and methods for forming components with thermal barrier coatings are provided. In this regard, an exemplary embodiment of a system for forming a component with a thermal barrier coating comprises: a modular component fixture having a shaft, multiple component mounts and a base cap; the shaft being attached to the base cap; each of the multiple component mounts being removably mountable to the base cap such that rotation of the shaft rotates the component mounts mounted to the base cap; each of the multiple component mounts defining a corresponding recess shaped to at least partially receive a corresponding component.

Another exemplary embodiment of a system for forming a component with a thermal barrier coating comprises: a component fixture having a shaft and a component mount; the shaft being operative to rotate the component mount; the component mount having a first side oriented to face away from a component, a second side oriented to face the component, and a raised edge extending outwardly from the second side such that the second side and the raised edge define a recess; the recess being shaped to at least partially receive a component mounted to the component mount for coating such that a first portion of the component located outside of the recess is positioned for being coated and a second portion of the component received within the recess is masked from being coated.

An exemplary embodiment of a method for forming a component with a thermal barrier coating comprises: providing a component having a first side and an opposing second side; and using a preformed mask to obstruct coating material from being deposited on the second side of the component while moving the component relative to the vapors such that the vapors form a thermal barrier coating on the first side of the component.

Other systems, methods, features and/or advantages of this disclosure will be or may become apparent to one with skill in the art upon examination of the following drawings and detailed description. It is intended that all such additional systems, methods, features and/or advantages be included within this description and be within the scope of the present disclosure.

BRIEF DESCRIPTION OF THE DRAWINGS

Many aspects of the disclosure can be better understood with reference to the following drawings. The components in the drawings are not necessarily to scale. Moreover, in the drawings, like reference numerals designate corresponding parts throughout the several views.

DETAILED DESCRIPTION

Systems and methods for forming components with thermal barrier coatings are provided, several exemplary embodiments of which will be described in detail. In this regard, some embodiments involve the use of component fixtures that can position multiple components at a time during a coating procedure, e.g., electron beam physical vapor deposition (EB-PVD). In some embodiments, the component fixtures are modular to accommodate different numbers of components. Component mounts, which facilitate attachment of components to a fixture, can function as preformed masks that restrict the ability of deposition materials to form coatings on portions of the components. As such, in some embodiments, the fixtures can facilitate selective application of coating materials on multiple components simultaneously.

Figure 1:
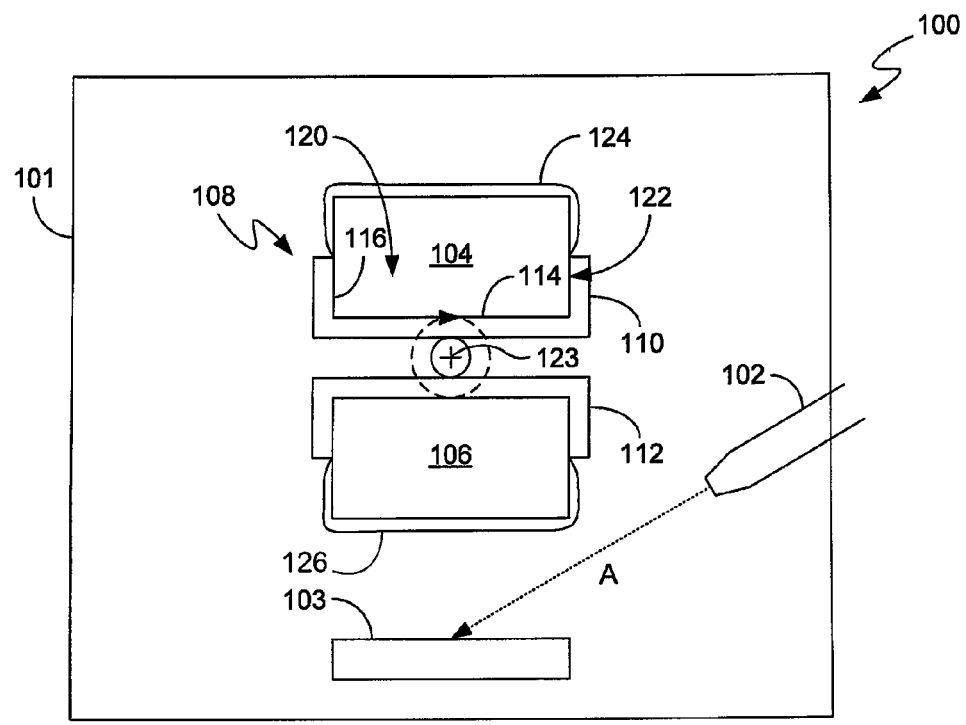
FIG. 1 is a schematic diagram depicting an exemplary embodiment of a system for forming components with thermal barrier coatings.

In this regard, reference is made to the schematic diagram of FIG. 1, which depicts an exemplary embodiment of a system for forming components with thermal barrier coatings. As shown in FIG. 1, system 100 incorporates a deposition chamber 101, an electron emitter 102 and target material 103. One or more components (e.g., components 104, 106) can be placed within deposition chamber 101 for coating.

System 100 also incorporates a component fixture 108 that includes component mounts 110, 112. Each of the mounts is used to mount a corresponding component for coating. Specifically, mount 110 mounts component 104 and mount 112 mounts component 106.

Each of the component mounts in this embodiment includes a recess that is defined by a surface (which faces the component) and a raised edge that extends outwardly from the surface. By way of example, mount 110 includes surface 114 and raised edge 116 that define recess 120. In FIG. 1, a portion 122 of component 104 is received within the recess.

In operation, an electron beam (depicted by arrow A) is directed at target material 103, which is formed of a composition corresponding to the desired coating composition. The electron beam evaporates the target material within the deposition chamber, which is sealed and maintained at relatively low pressure. Target vapor ("evaporant") fills the chamber and condenses on exposed surfaces of the components 104, 106, which are moved within the chamber by fixture 108. Specifically, in this embodiment, the fixture rotates the components about an axis 123. As such, a coating 124 is formed on a portion of component 104, and a coating 126 is formed on a portion of component 106. Notably, coatings are not formed on corresponding portions of the components that are received within the recesses of the component mounts. Thus, in addition to positioning the components for coating, the component mounts function as preformed masks for selectively masking application of the coating material to the components.

Figure 2:
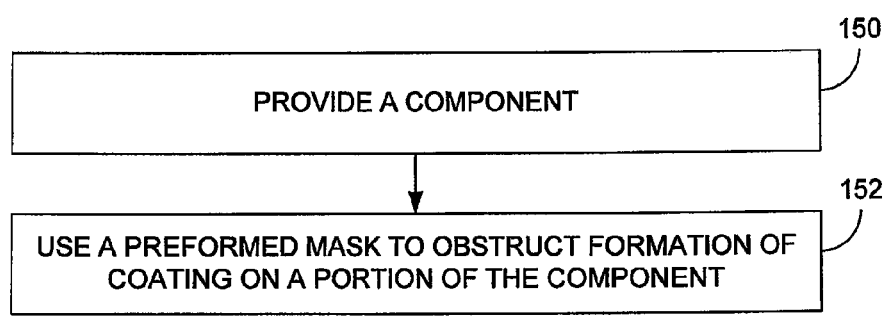
FIG. 2 is a flowchart depicting an exemplary embodiment of a method for forming components with thermal barrier coatings.

FIG. 2 is a flowchart depicting an exemplary embodiment of a method for forming components with thermal barrier coatings. In this regard, the method (which may be attributable to the functionality of a system, such as that depicted in FIG. 1) may be construed as beginning at block 150, in which a component is provided. In some embodiments, the component can be a gas turbine engine component such as a panel for use in a combustion section of a gas turbine engine. In block 152, a preformed mask is used to obstruct coating material from being deposited on at least a portion of the component. Notably, the coating material is used to form a thermal barrier coating. In some embodiments, the coating material is applied to the component using an electron beam physical vapor deposition (EB-PVD) process, with the coating material being a Gadolinia-stabilized Zirconia thermal barrier coating material. Clearly, various other deposition processes and/or materials can be used in other embodiments. By way of example, thermal spray processes and Yttria-stabilized Zirconia coating materials can be used.

Figure 3:
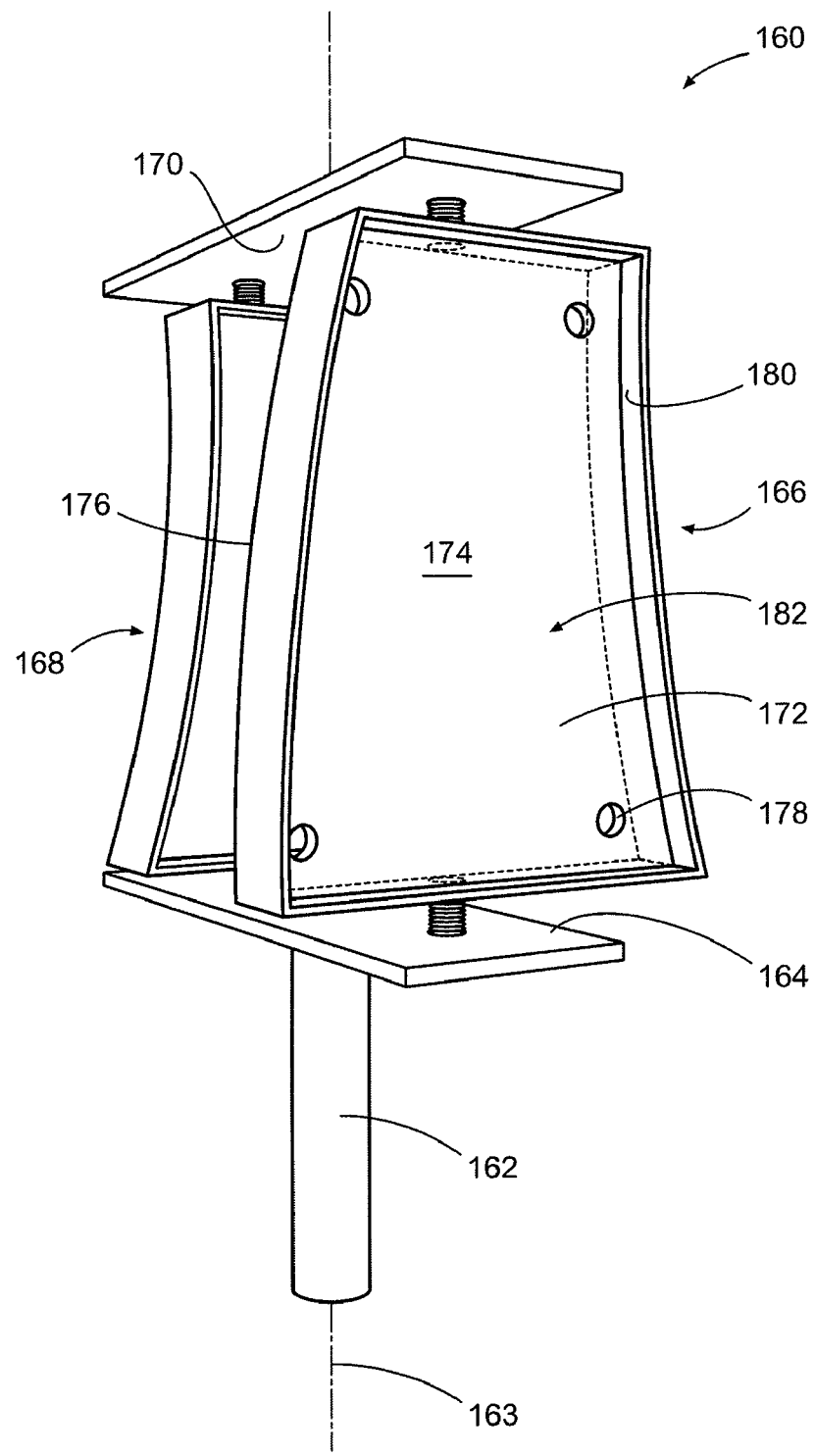
FIG. 3 is a schematic diagram depicting another exemplary embodiment of a system for forming components with thermal barrier coatings.

FIG. 3 is a schematic diagram depicting another exemplary embodiment of a system for forming components with thermal barrier coatings. In particular, FIG. 3 depicts an embodiment of a component fixture. Fixture 160 includes a shaft 162 that extends along a longitudinal axis 163. A base cap 164 is attached to the shaft that supports one or more detachable component mounts. In this embodiment, two component mounts (166, 168) are attached to the base cap. Specifically, each of the component mounts extends between the base cap 164 and an end cap 170. Attachment of the component mounts, end cap and base cap can be provided in a variety of manners, such as by using removable mechanical fasteners (e.g., bolts). In other embodiments, fixed fasteners can be used (e.g., externally threaded posts welded to the caps).

In the embodiment of FIG. 3, component mount 166 includes a base 172 that has a side 174 (which is configured to face a component) and a side 176 (which is configured to face away from the component). Base 172 also includes provisions for mounting a component. Specifically, mounting holes (e.g., hole 178) are provided through which portions of a component can extend for securing the component to the component mount.

A raised edge 180 extends outwardly from a periphery of side 174 to define a recess 182. Thus, when a component is mounted to the component mount, at least a portion of that component is positioned within the recess. So configured, the component mount can function as a preformed mask for preventing coating material from being deposited on that portion of a component positioned within the recess.

Various sizes, shapes, orientations and/or numbers of component mounts can be used in a component fixture. Additionally, various materials can be used. By way of example, steel, nickel and cobalt alloys can be used.

Figure 4:
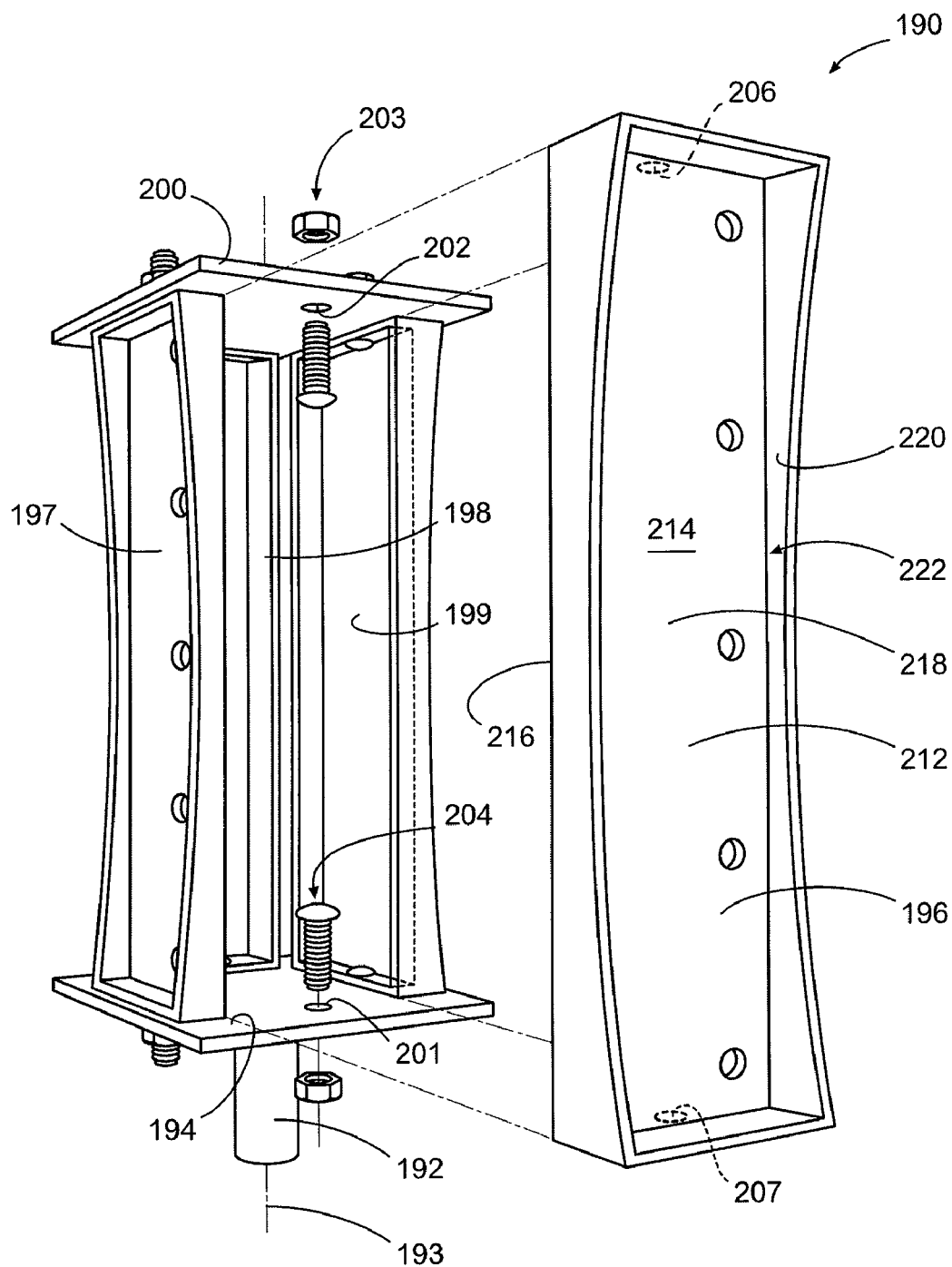
FIG. 4 is a partially-exploded, schematic diagram depicting another exemplary embodiment of a component fixture.

FIG. 4 is a partially-exploded, schematic diagram depicting another exemplary embodiment of a component fixture. As shown in FIG. 4, component fixture 190 includes a shaft 192 that extends along a longitudinal axis 193. A base cap 194 is attached to the shaft that supports up to four detachable component mounts (196, 197, 198 and 199). Each of the component mounts extends between the base cap 194 and an end cap 200. Attachment of the component mounts is shown in detail with respect to component mount 196, which is depicted in an assembly view. Notably, base cap 194 includes a mounting hole 201, end cap 200 includes a mounting hole 202 and fastener assemblies 203, 204 are used to secure the component mount 196 to the fixture. Specifically, fastener assembly 203 is inserted through hole 202 and hole 206 of the component mount, and fastener assembly 204 is inserted through hole 201 and hole 207 of the component mount. In other embodiments, fixed fastener assemblies can be used for attaching the component mounts.

In the embodiment of FIG. 4, component mount 196 includes a base 212 that has a side 214 (which is configured to face a component) and a side 216 (which is configured to face away from the component). Base 212 also includes provisions for mounting a component. Specifically, mounting holes (e.g., hole 218) are provided through which portions of a component can extend for securing the component to the component mount.

A raised edge 220 extends outwardly from a periphery of side 214 to define a recess 222. Thus, when a component is mounted to the component mount, at least a portion of that component is positioned within the recess. So configured, the component mount can function as a preformed mask for preventing coating material from being deposited on that portion of a component positioned within the recess. Notably, side 214 is concave such that the recess extends inwardly toward an axis of rotation of the fixture.

Figure 5:
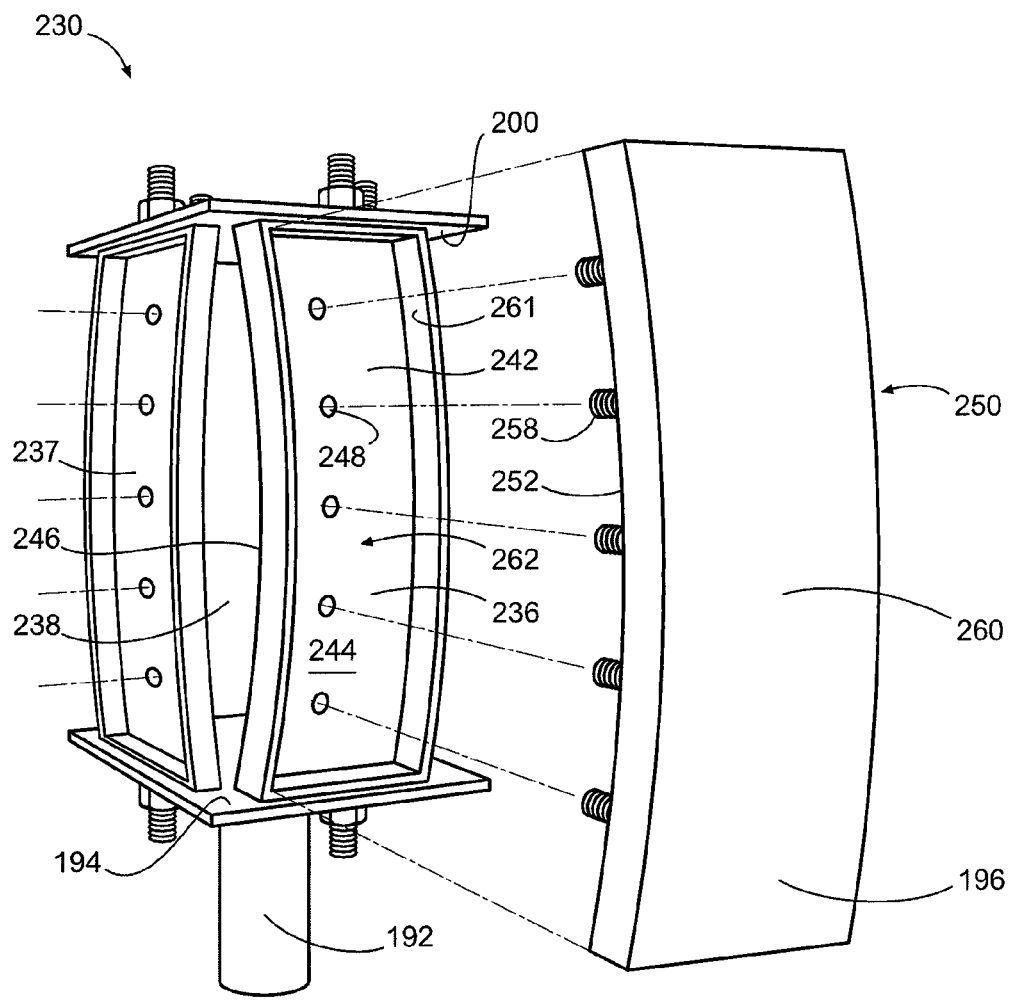
FIG. 5 is a schematic diagram depicting another exemplary embodiment of a component fixture with a representative component.

FIG. 5 is a schematic diagram depicting another exemplary embodiment of a component fixture with a representative component. In particular, fixture 230 uses shaft 192, base cap 194 and end cap 200 of the embodiment of FIG. 4; however, the modular nature of the fixture is shown in greater detail in that the component mounts of that embodiment have been replaced with four other detachable component mounts (three of which, 236, 237, 238 being shown).

In the embodiment of FIG. 5, component mount 236 includes a base 242 that has a side 244 (which is configured to face a component) and a side 246 (which is configured to face away from the component). Base 242 also includes provisions for mounting a component. Specifically, mounting holes (e.g., hole 248) are provided through which portions of a component can extend for securing the component to the component mount. By way of example, component 250 (which includes an exterior surface 252 complementary in shape to that of side 244) incorporates mounts (e.g., mount 258) that engage within corresponding mounting holes (e.g., hole 248) of the component mount.

A raised edge 260 extends outwardly from a periphery of side 244 to define a recess 262. In contrast to the embodiment of FIG. 4, side 244 is convex such that the recess extends outwardly away from an axis of rotation of the fixture. Notably, when mounted to component mount 236, at least surface 260 of component 250 remains unmasked for receiving a coating.

It should be emphasized that the above-described embodiments are merely possible examples of implementations set forth for a clear understanding of the principles of this disclosure. Many variations and modifications may be made to the above-described embodiments without departing substantially from the spirit and principles of the disclosure. All such modifications and variations are intended to be included herein within the scope of this disclosure and protected by the accompanying claims.

The invention claimed is:

1. A system for forming a gas turbine engine component with a thermal barrier coating comprising:

a gas turbine engine component;

a component fixture having a shaft and a component mount, the component fixture comprising a base cap and an end cap;

the shaft being operative to rotate the component mount, the shaft attached to the base cap;

the component mount having a first side oriented to face away from the component, a second side oriented to face the component, and a raised edge extending outwardly from the second side such that the second side and the raised edge define a recess, the component mount extending between the base cap and the end cap;

the recess being shaped to at least partially receive the component mounted to the component mount for coating such that a first portion of the component located outside of the recess is positioned for being coated and a second portion of the component received within the recess is masked from being coated.

2. The system of claim 1, wherein:

the system further comprises a deposition chamber operative to facilitate electron beam physical vapor deposition of a thermal barrier coating; and the component fixture is operative to position the component within the deposition chamber and rotate the component such that the first portion of the component is coated with the thermal barrier coating.

3. The system of claim 1, wherein the component mount is a first of multiple component mounts operative to rotate with the shaft.

4. The system of claim 1, wherein the second side of the component mount is contoured to complement a contour exhibited by the second portion of the component.

5. The system of claim 4, wherein the second side of the component mount is convex.

6. The system of claim 4, wherein the second side of the component mount is concave.

7. The system of claim 1, wherein:

the shaft has a longitudinal axis; and the component mount is operative to rotate with the shaft about the longitudinal axis.

8. The system of claim 1, wherein the component mount is removably attached to the component fixture.

9. The system of claim 1, wherein the second side of the component mount has a mounting hole operative to receive a mount of the component therethrough to secure the component to the component mount such that the component rotates with the component fixture.

10. A system for forming a component with a thermal barrier coating comprising:

a modular component fixture having a shaft, multiple component mounts and a base cap;

the shaft being attached to the base cap;

each of the multiple component mounts being removably mountable to the base cap such that rotation of the shaft rotates the component mounts mounted to the base cap;

each of the multiple component mounts defining a corresponding recess shaped to at least partially receive a corresponding component, wherein a first of the multiple component mounts has a first recess with one of a convex surface and a concave surface.

11. The system of claim 10, wherein:

a first of the multiple component mounts has a first recess with a convex surface; and a second of the multiple component mounts has a second recess with a concave surface.

12. The system of claim 10, wherein:

the first of the multiple component mounts has a first hole formed through the convex surface for mounting a component at least partially within the first recess; and the second of the multiple component mounts has a second hole formed through the concave surface for mounting a component at least partially within the second recess.

13. The system of claim 1, wherein the first portion of the component faces away from a longitudinal axis of the shaft.

14. A system for forming a gas turbine engine component with a thermal barrier coating comprising:

a gas turbine engine component;

a component fixture having a shaft and a component mount;

the shaft being operative to rotate the component mount;

the component mount having a first side oriented to face away from a the component, a second side oriented to face the component, and a raised edge extending outwardly from the second side such that the second side and the raised edge define a recess;

the recess being shaped to at least partially receive a the component mounted to the component mount for coating such that a first portion of the component located outside of the recess is positioned for being coated and a second portion of the component received within the recess is masked from being coated;

wherein the first portion of the component faces away from a longitudinal axis of the shaft; and further including a base cap attached to the shaft, and further including that the component mount is one of at least two component mounts attached to the base cap for rotation about the longitudinal axis of the shaft.

15. The system of claim 1, wherein, when mounted in the component mount, the component is disposed entirely on the second side of the component mount.

16. The system of claim 1, wherein, after coating, the first portion of the component is coated and the second portion of the component is not coated.

17. The system of claim 1, wherein the first and second sides are opposing sides of a single wall of the component mount.

18. The system of claim 10, wherein the component is a gas turbine engine component.

19. The system of claim 18, wherein the component is a combustor panel for a combustion section of a gas turbine engine.

20. The system of claim 10, wherein the multiple component mounts are spaced apart from one another on the base cap.

21. The system of claim 10, wherein each of the multiple component mounts supports a respective component.

22. The system of claim 10, wherein the multiple component mounts includes four component mounts.

* * * * *